(12) United States Patent
Kim et al.

(10) Patent No.: US 6,300,022 B2
(45) Date of Patent: Oct. 9, 2001

(54) METHOD FOR FABRICATING SCREEN IN COLOR CRT

(75) Inventors: Tae Yong Kim, Kyongsangbuk-do; Jae Hyoung Ju, Taegu, both of (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/750,313

(22) Filed: Dec. 29, 2000

(30) Foreign Application Priority Data

Dec. 30, 1999 (KR) ................................................ 99/67404

(51) Int. Cl.[7] .................................................. H01J 9/227
(52) U.S. Cl. ................................................................ 430/27
(58) Field of Search .......................... 430/27, 23; 427/68

(56) References Cited

U.S. PATENT DOCUMENTS 6,215,240 * 4/2001 Fukuhara ............................ 313/461

FOREIGN PATENT DOCUMENTS 53-131757 * 11/1978 (JP) .
9-245640 * 9/1997 (JP) .

* cited by examiner

*Primary Examiner*—John A. McPherson
(74) *Attorney, Agent, or Firm*—Fleshner & Kim, LLP

(57) ABSTRACT

Method for fabricating a screen in a color CRT, in which, in formation of a color filter film and a fluorescent film on the same time, a pigment layer is formed, a photo sensitive resin solution is coated thereon, a fluorescent material layer is sprayed thereon, and the pigment layer and the fluorescent film are exposed and developed, to prevent the pigment layer and the fluorescent film from peeling off and to form thin and close packed fluorescent films on the photo sensitive resin solution, for enhancing a contrast and a color purity as well as a luminance and cutting characteristics, the color display having three color (blue, green, and red) color filter films and fluorescent films in a color pixel region of an inside surface of a panel having a black matrix formed thereon, wherein each of three color pigment filter layers and fluorescent material layers are formed in succession by a method including the steps of (1) coating pigment dispersed slurry to form a pigment filter layer, (2) coating photosensitive agent resin solution on the pigment filter layer, (3) spraying powder of fluorescent material on the photosensitive agent resin film, to form a fluorescent material layer, and (4) exposing, and developing the pigment filter layer and the fluorescent material layer on the same time.

6 Claims, 8 Drawing Sheets

METHOD FOR FABRICATING SCREEN IN COLOR CRT

BACKGROUND OF THE INVENTION

1. Field of the Invention

The present invention relates to a method for fabricating a screen in a color CRT(Cathode Ray Tube), and more particularly, to a method for fabricating a screen in a color CRT, in which, in formation of a color filter film and a fluorescent film on the same time, a pigment layer is formed, a photo sensitive resin solution is coated thereon, a fluorescent material layer is sprayed thereon, and the pigment layer and the fluorescent film are exposed and developed, to prevent the pigment layer and the fluorescent film from peeling off and to form thin and close packed fluorescent films on the photo sensitive resin solution, for enhancing a contrast and a color purity as well as a luminance and cutting characteristics.

2. Background of the Related Art

Figure 1:
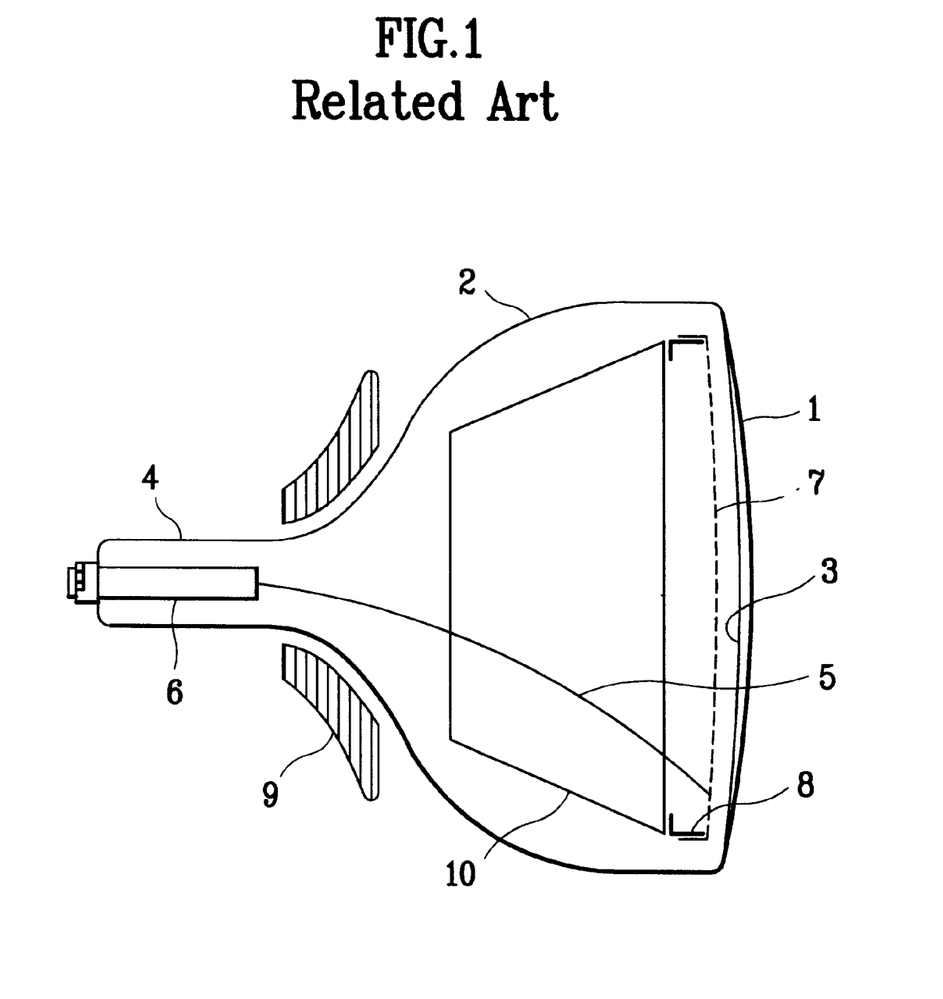
FIG. 1 illustrates a section of a related art color cathode ray tube.

Referring to FIG. 1, the color CRT is provided with a panel 1 having a flourescent film 3 coated on an inside surface thereof, a funnel 2 welded to the panel 1 by using a welding glass having a conductive graphite coated on an inside surface thereof, an electron gun 6 mounted in a neck 4 of the funnel 2 for emission of electron beams 5, a shadow mask 7 inside of the panel 1 supported on a frame 8 for selection of a color, and a deflection yoke 9 on an outer circumference of the funnel for deflection of the electron beams in left and right directions. In the cathode ray tube, when a video signal is received at the electron gun 6, thermal electrons are emitted from a cathode in the electron gun, and travels toward the panel as the electron beams are accelerated and converged by voltages applied thereto from respective electrodes of the electron gun. In this instance, the electron beams 5 has travel paths adjusted by magnetic fields from magnets fitted in the neck of the funnel, directed onto an inside surface of the panel by the deflection yoke 9, subjected to color selection as the electron beams 5 pass through slots in the shadow mask 7, and hit the fluorescent film 3 on the inside surface of the panel, to reproduce the video signal. And, in order to prevent the electron beams from being influenced from, and deflected by the geomagnetism in a course of passing through the slot in the shadow mask, and reaching to the fluorescent film, there is an inner shield 10 fitted to a rear side of the frame when it is seen from the panel.

A related art method for fabricating a screen having a color filter film for a color group the same with a fluorescent film formed on an inside surface of a panel for enhancing a luminance and contrast will be explained with reference to FIGS. 2A~2I.

Figure 2A:
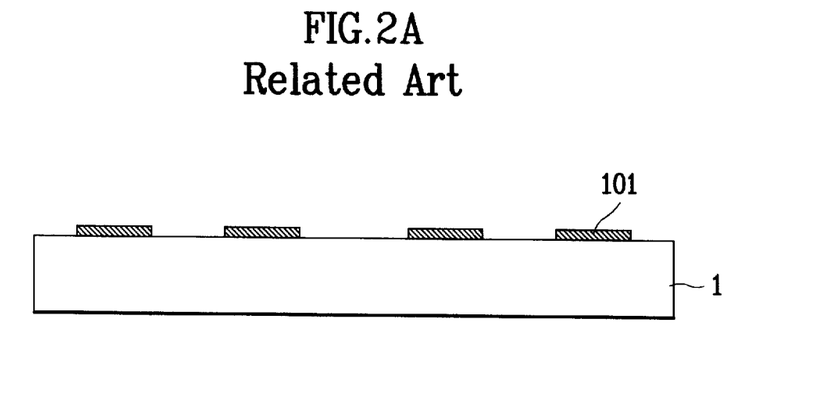
FIGS. 2A~2I illustrate sections showing the steps of a related art method for fabricating a screen.
Figure 2B:
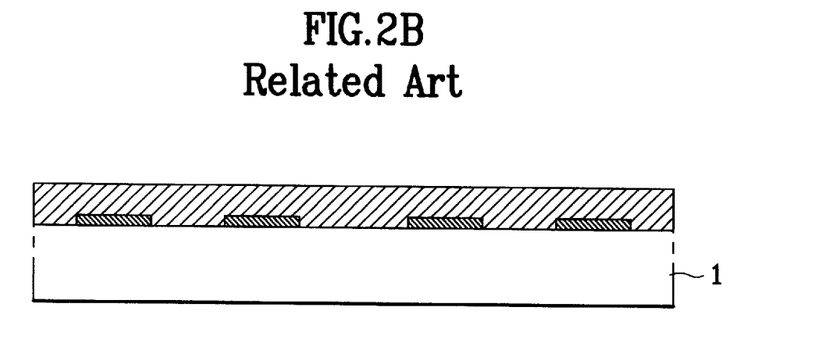
Figure 2C:
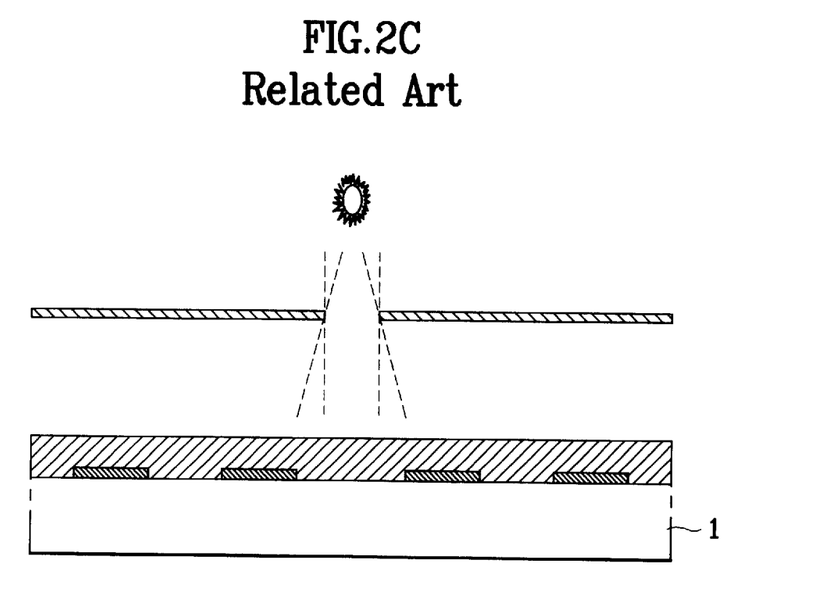
Figure 2D:
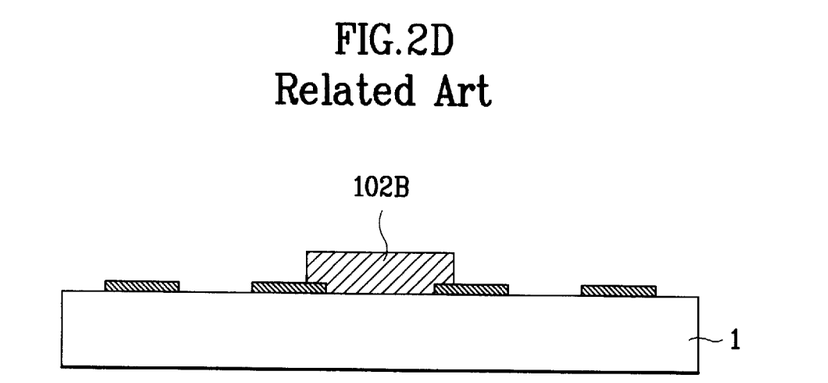
Figure 2E:
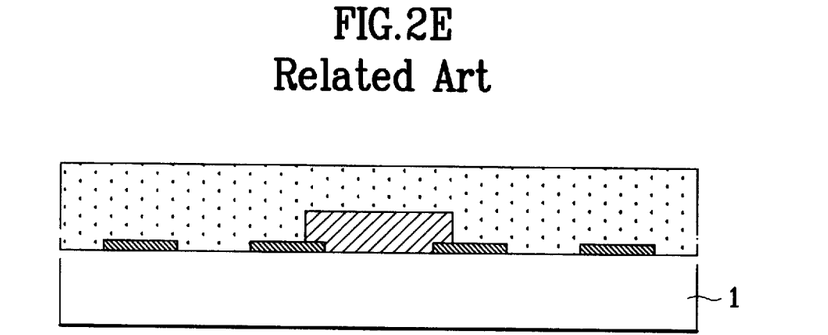
Figure 2F:
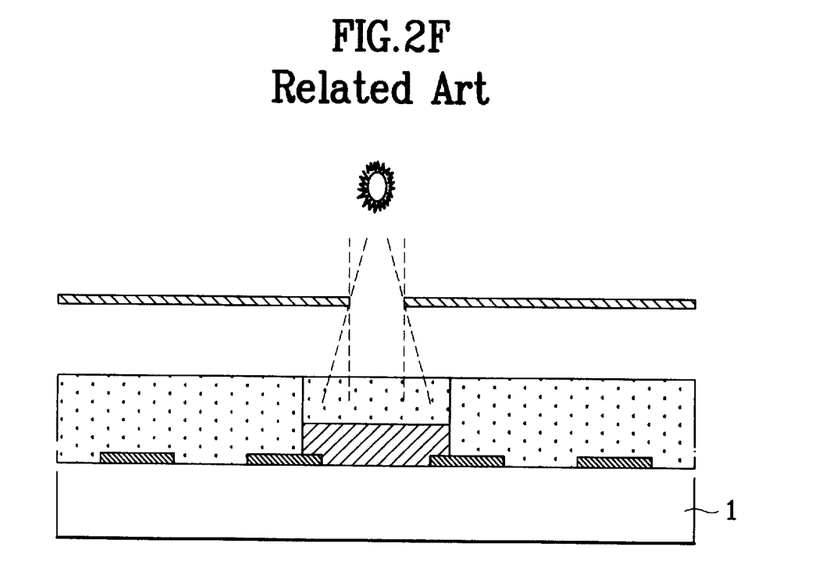
Figure 2G:
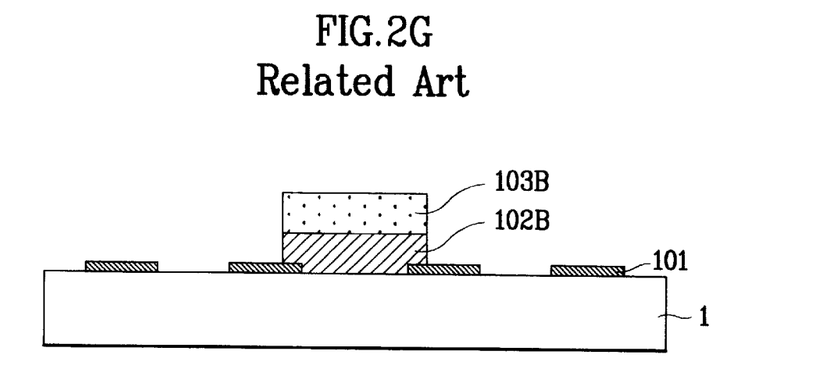
Figure 2H:
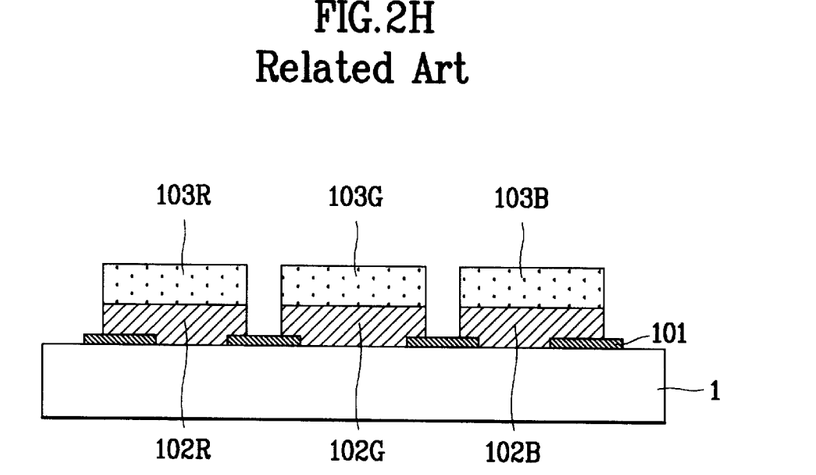
Figure 2I:
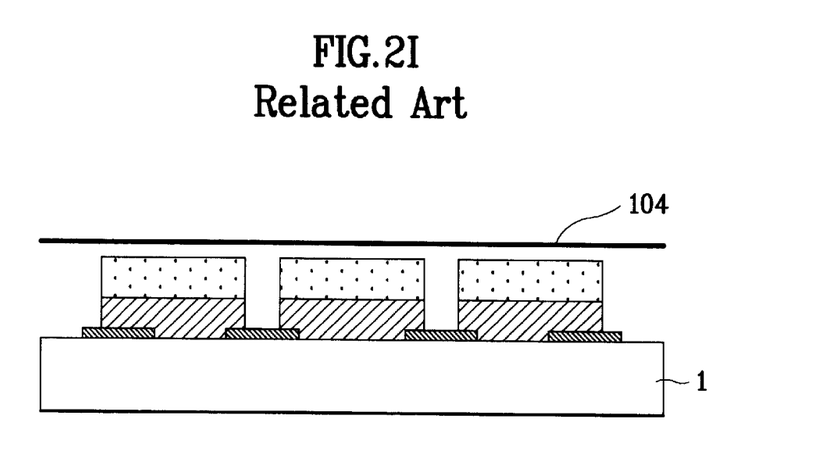

An inside surface of the panel 1 is cleaned by using caustic soda and hydrofluoric acid, photoresist(PAD+Azide group) is coated on the inside surface of the panel by whirler, the photoresist is dried, and red, blue and green fluorescent films are exposed on an exposer by using a high pressure mercury lamp, to radiation cure the exposed portions not for using, and developed by pure water at a fixed development pressure of 3~5 kgf/cm$^2$. And, a coat of graphite is applied thereon, and dried, etched with an etching solution($H_2O_2$+ $NH_4OH$), to form a light absorbing film(a black matrix) 101 as shown in FIG. 2A, and, as disclosed in JP publication No. S64-7457, a photosensitive slurry containing a first color (such as blue) pigment is coated on the inside surface of the cathode ray tube to form a first color pigment layer as shown in FIG. 2B. The first color pigment layer is dried(FIG. 2C), and exposed by using an exposure mask, and unexposed portion of which are removed by development, to form the first color pigment layer 102B as shown in FIG. 2D. After formation of a second color(such as green) pigment layer and a third color(such as blue) pigment layer in succession in the same process as the first color pigment filter layer 102B, a fluorescent layer is formed. That is, a photo sensitive slurry containing a first color(such as blue) fluorescent material particles is coated on the pigment layer as shown in FIG. 2E, to form a first color fluorescent material layer, dried, exposed by using an exposure mask as shown in FIG. 2F, developed, and dried, to remove unexposed portions as shown in FIG. 2G, to form a first color fluorescent material layer 103B on the first pigment filter layer 102B. Then, a second color fluorescent material layer 103G and a third color fluorescent material layer 103R are formed in succession by the same process as the first fluorescent material layer forming process, to provide the pigment filter layers 102R and 102G, and a fluorescent film first layers 103R and 103G as shown in FIG. 2H, and then, a metal reflection film 104 of aluminum is formed as shown in FIG. 2I.

As an alternative method(JP publication No. H4-26679) to the foregoing related art method for fabricating a screen, in which formation of the pigment layers and the fluorescent material layers are done almost on the same time, by applying a coat of photosensitive slurry containing a first color(for example, blue) to the inside surface of the panel to form a first color pigment layer, applying a coat of photosensitive slurry containing the first color(for example, blue) fluorescent material particles to the first color pigment layer to form a first color fluorescent material layer, exposing and developing the first color pigment layer and the first color fluorescent material layer on the same time by using an exposure mask, to remove unexposed portions to form a first color pigment layer and fluorescent material layer at a position corresponding to the first color. Then, by using the same process, a second color layer(green) and a second fluorescent material layer, and a third color layer(red) and a third fluorescent material layer are formed in succession.

Because the method disclosed in JP publication No. S64-7457 requires coating, exposure, and development for a photosensitive slurry containing a pigment or a fluorescent material for three color pigments and three color fluorescent material, the method requires two times of steps compared to a case when fluorescent material patterns of fluorescent material having pigment attached thereto, that increases the fabrication cost. And, because the method disclosed in JP publication No. H4-26679 omits exposure and development for the blue, green, and red pigment layers respectively, though the method disclosed in JP publication No. H4-26679 is advantageous in that a production cost is saved since the method disclosed in JP publication No. H4-26679 has less fabrication steps, the omission of the exposure and development of the pigment layer is not favorable for formation of a high quality fluorescent material surface. That is, as the photosensitive slurry in formation of the pigment layer, though a mixed solution of polyvinylalcohol as a photosensitive agent and bichromate as a photo cross linking agent is in general used, if the fluorescent material slurry is coated on an unexposed or undeveloped pigment layer as disclosed in JP publication No. H4-26679, photosensitive components contained in the pigment layer, particularly the bichromate as the photo cross linking agent, start to be dissolved in water contained in the alkali slurry since the bichromate is a material dissolved in water well. As a result of this, when the pigment layer and the fluorescent material layer are exposed, the exposed portion is not cured adequately due to lack of the photo cross linking agent in the pigment layer. And, the fluorescent material layer with a 20~30 μm thickness before the exposure is too thick to be photo cured adequately when the filter layer and the fluorescent material layer are exposed on the same time. That is, the inadequate cure of the pigment layer leads the pigment layer and the fluorescent material layer susceptible to peeling in development of the pigment layer and the fluorescent material layer after exposure, that impedes formation of a high quality fluorescent material surface.

SUMMARY OF THE INVENTION

Accordingly, the present invention is directed to a method for fabricating a screen in a color CRT that substantially obviates one or more of the problems due to limitations and disadvantages of the related art.

An object of the present invention is to provide a method for fabricating a screen in a color CRT, which can form a close packed fluorescent material film for enhancing a luminance and cutting characteristics as well as contrast and color purity, and simplifying fabrication process to reduce a production cost.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating a screen in a color display having three color(blue, green, and red) color filter films and fluorescent films in a color pixel region of an inside surface of a panel having a black matrix formed thereon, wherein each of three color pigment filter layers and fluorescent material layers are formed in succession by a method including the steps of (1) coating pigment dispersed slurry to form a pigment filter layer, (2) coating photosensitive agent resin solution on the pigment filter layer, (3) spraying powder of fluorescent material on the photosensitive agent resin film, to form a fluorescent material layer, and (4) exposing, and developing the pigment filter layer and the fluorescent material layer on the same time.

The fluorescent material layer has a thickness of 7~20 μm, and a photoresist film containing the pigment has a thickness of 0.5~3 μm.

The pigment has an average particle size ranging 0.02~0.1 μm, and a content of the pigment is 5~30 wt %, and composition of the photosensitive resin is 80~90 wt % of pure water, 3~10 wt % binder, 0.1~10 wt % photosensitive agent, and 0.0~3 wt % of dispersant. And, the fluorescent material has an average particle size ranging 3~12 μm. 2. A method as claimed in claim 1, wherein the fluorescent material layer has a thickness of 7~20 μm.

The method for fabricating a screen in a color CRT of the present invention can enhance luminance, cutting characteristics, a contrast, and color purity, and reduce cost owing to a simplified fabrication process.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings. In explanation of the present invention, the same components will be given the same name and reference symbols, and explanations for the same will be omitted. FIGS. 3A~3G illustrate sections showing the steps of a method for fabricating a screen in accordance with a preferred embodiment of the present invention.

Figure 3A:
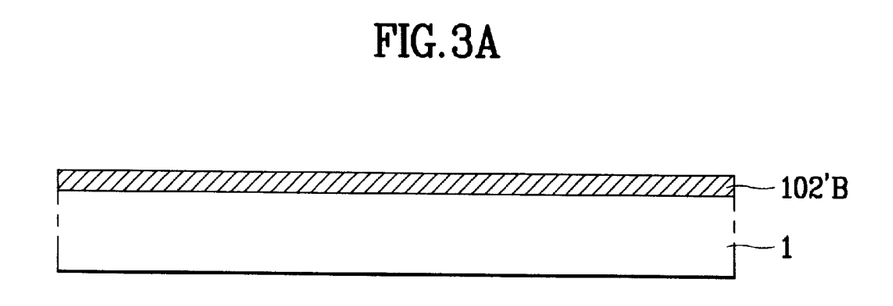
FIGS. 3A~3G illustrate sections showing the steps of a method for fabricating a screen in accordance with a preferred embodiment of the present invention; and, FIG. 4 illustrates spectra of lights transmitted through a color filter.
Figure 3B:
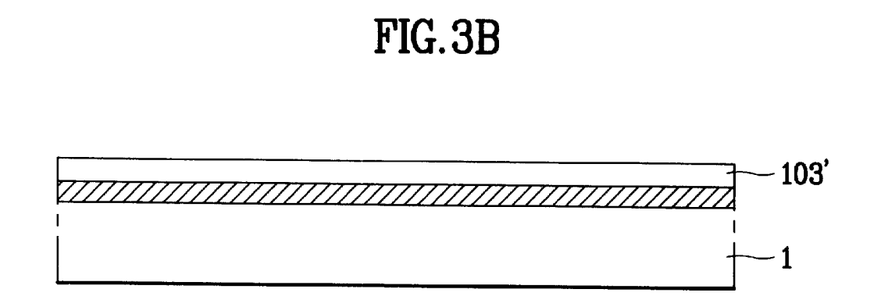
Figure 3C:
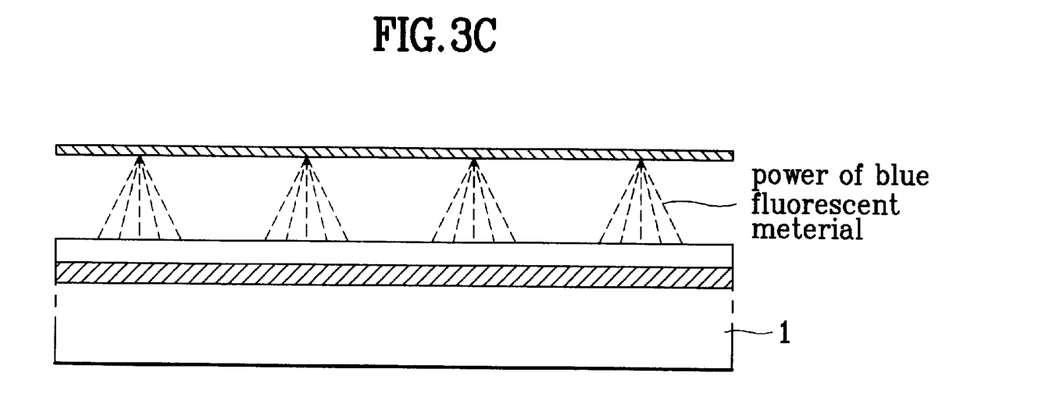
Figure 3D:
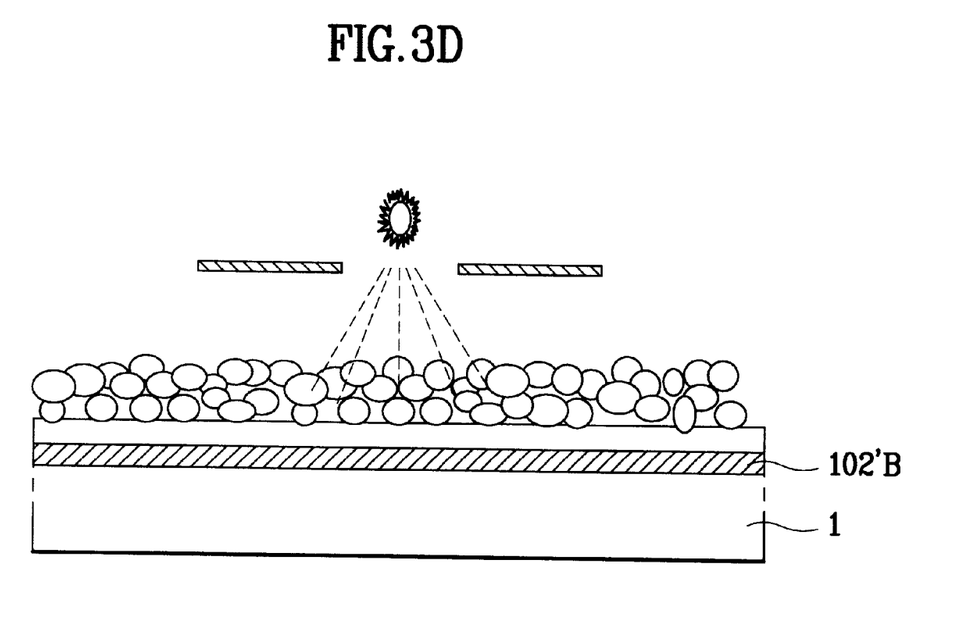
Figure 3E:
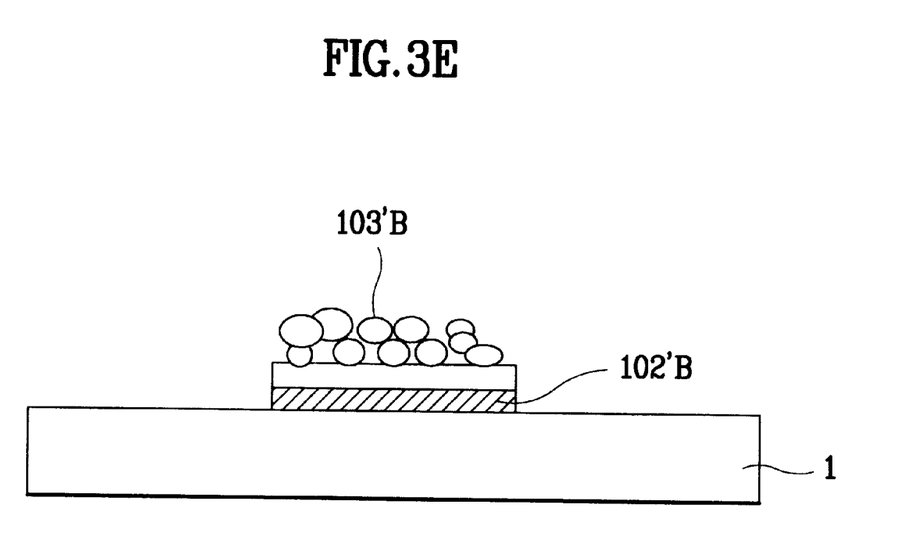
Figure 3F:
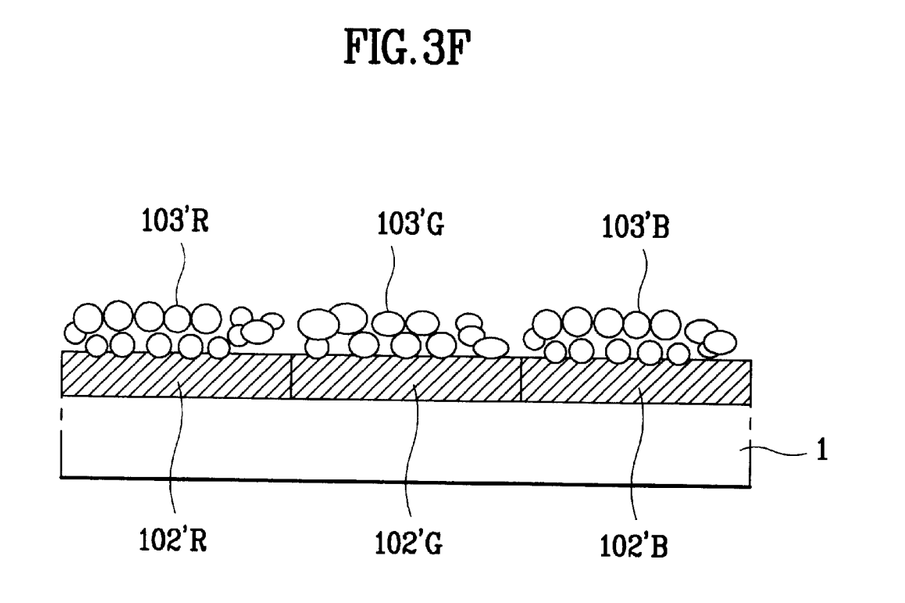
Figure 3G:
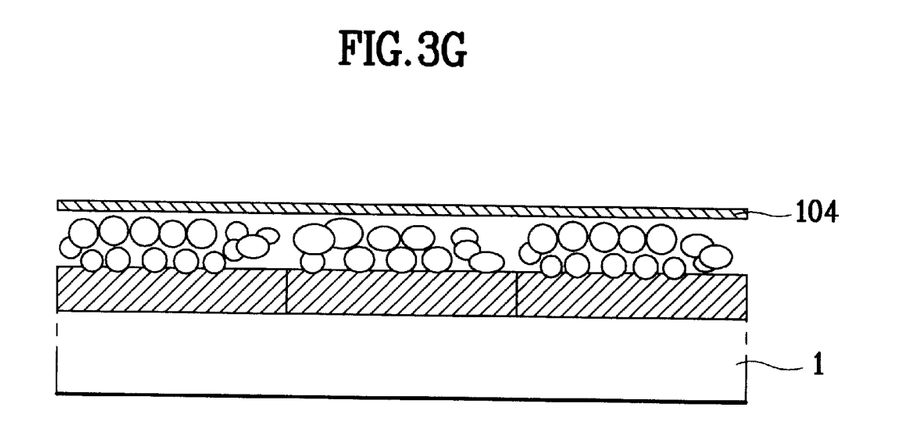

Referring to FIG. 3A, after an inside surface of the panel is cleaned with caustic soda and hydrofluoric acid, a coat of pigment dispersed slurry 102'B containing blue pigment (cobalt blue: $CoO—Al_2O_3$) with particle sizes ranging 0.02~0.2 μm, a dispersant, and one of photosensitive agent selected from PVA-SDC group, PVA-ADC group, and PVA-Azide group is applied to the inside surface of the panel at a liquid viscosity 5cp~50cp/25° C. and 100~400 rpm, and the coat is dried by a heater. Then, as shown in FIG. 3B, a coat of photosensitive resin solution 103' containing one of photosensitive agent selected from PVA-SDC group, PVA-ADC group, PVA-SBQ group, and PVA-Azide group which contains no adhesive blue fluorescent material is applied to the blue color filter layer by spinning. And, as shown in FIG. 3C, powder of blue fluorescent material is sprayed thereon to form a fluorescent surface. Composition of the pigment dispersed slurry is 55~90 wt % of pure water, 5~30 wt % of blue pigment, 0.5~3 wt % of photosensitive agent, a very small amount of dispersant, and composition of the photosensitive resin solution is 80~90 wt % of pure water, 0.1~10 wt % of photosensitive agent, and 0.01~1.0 wt % of dispersant. As shown in FIG. 3D, after the fluorescent surface is dried, a position of the blue fluorescent film is exposed by using an exposer of a high pressure mercury lamp, to photo cure the blue fluorescent film to be insolvable, and, as shown in FIG. 3E, the fluorescent surface is developed by a pure water with a development pressure of 2~5 $kgf/cm^2$, to form dotted or striped blue color filter film 102'B and blue fluorescent film 103'B on the same time. Then, as shown in FIG. 3F, green and red color filter films and fluorescent films are also formed by the same fabrication method in succession, to form, as shown in FIG. 3F, three color filter films 102'B, 102'G, and 102'R and three color fluorescent films 103'B, 103'G, and 103'R. Then, as shown in FIG. 3G, a reflection film 104 of aluminum is formed thereon. The green color filter film is form of cobalt green pigment, and the red color filter film is formed of $Fe_2O_3$ pigment.

The screen of the present invention formed thus has a film thickness of 0.5~3 μm of the pigment dispersed slurry inclusive of the photosensitive agent as the photoresist and the fluorescent material are formed respectively. Because the selective transmission of an external light is not adequate if the film thickness is below 0.5 μm, and because the adhesive force of the glass and the pigment film become poor if the film thickness is greater than 3 μm, to damage the pigment film when the photosensitive resin solution is applied for forming the fluorescent film, a good quality of screen can not be obtained. And, the fluorescent film of the present invention has a total thickness of 7~20 μm, which is formed by coating the photosensitive resin solution and spraying fluorescent material powder with an average particle size 3~12 μm thereon to penetrate into the coat, while the fluorescent film of the related art has a thicker thickness of 20~30 μm as the photosensitive agent is contained in the fluorescent material slurry. Accordingly, though the related art fluorescent film has a rough cutting characteristics, the fluorescent film of the present invention having a thickness thinner than the same of the related art has an excellent exposure strength in exposure, and a cutting characteristics three times better than the same of the related art as a boundary region of the film formed when the film is exposed and developed is little.

Figure 4:
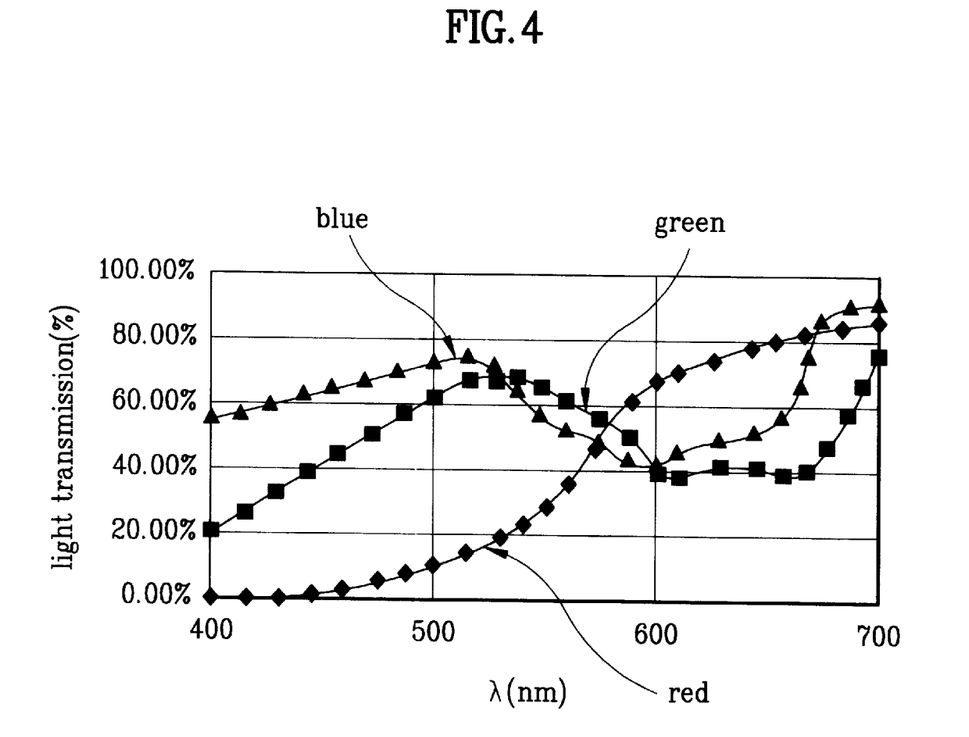

Referring to FIG. 4, the method for fabricating a screen in a color CRT of the present invention permits to provide a high quality color cathode ray tube having improved characteristics of a contrast, a luminance, and a color purity as the screen selectively reflects an external light through the filter layer, and selectively transmits a light emitted from the fluorescent material. Table 1 below shows a comparison of luminances and contrasts of a color filter tube of the present invention and a related art color filter tube with the related art slurry having the color filter films and fluorescent films of the present invention and the related art respectively for models having the same glass transmission factors at 26 kV and 600 mA applied current.

TABLE 1

|  | The present invention | The related art |
|---|---|---|
| Luminance | 39.7 (109.6%) | 36.2FL (100%) |
| Contrast | 27.8 (102.2%) | 27.2 (100%) |

*Luminance/contrast measurement data (lk = 600)

As has been explained, the method for fabricating a screen in a color CRT of the present invention can provide a screen having a luminance enhanced by 5~10%, improved cutting characteristics, contrast and color purity, and a low cost owing to a simplified fabrication process, by forming pigment layers on an inside surface of a panel of the color cathode ray tube, coating a photosensitive resin solution thereon, coating powder of fluorescent material thereon, and exposing and developing the pigment layers and the fluorescent films on the same time, thereby forming a thin fluorescent film with an excellent packing to form a close packed structure.

It will be apparent to those skilled in the art that various modifications and variations can be made in the method for fabricating a screen in a color CRT of the present invention without departing from the spirit or scope of the invention. Thus, it is intended that the present invention cover the modifications and variations of this invention provided they come within the scope of the appended claims and their equivalents.

What is claimed is:

1. A method for fabricating a screen in a color display having three color (blue, green, and red) color filter films and fluorescent films in a color pixel region of an inside surface of a panel having a black matrix formed thereon, wherein each of three color pigment filter layers and fluorescent material layers are formed in succession by a method comprising the steps of:

(1) coating pigment dispersed slurry to form a pigment filter layer;
   (2) coating photosensitive agent resin solution on the pigment filter layer;
   (3) spraying powder of fluorescent material on the photosensitive agent resin film, to form a fluorescent material layer; and,
   (4) exposing, and developing the pigment filter layer and the fluorescent material layer on the same time.

2. A method as claimed in claim 1, wherein the fluorescent material layer has a thickness of 7~20 μm.

3. A method as claimed in claim 1, wherein a photoresist film containing the pigment has a thickness of 0.5~3 μm.

4. A method as claimed in claim 1, wherein the pigment has an average particle size ranging 0.02~0.1 μm, and a content of the pigment is 5~30 wt %.

5. A method as claimed in claim 1, wherein composition of the photosensitive resin is 80~90 wt % of pure water, 3~10 wt % binder, 0.1~10 wt % photosensitive agent, and 0.01~3 wt % of dispersant.

6. A method as claimed in claim 1, wherein the fluorescent material has an average particle size ranging 3~12 μm.

* * * * *